US008642358B2

(12) United States Patent
Lee

(10) Patent No.: US 8,642,358 B2
(45) Date of Patent: Feb. 4, 2014

(54) METHOD FOR FABRICATING MAGNETIC TUNNEL JUNCTION DEVICE

(75) Inventor: Min Suk Lee, Seongnam-si (KR)

(73) Assignees: Hynix Semiconductor Inc., Gyeonggi-do (KR); Grandis, Inc., Milpitas, CA (US)

(*) Notice: Subject to any disclaimer, the term of this patent is extended or adjusted under 35 U.S.C. 154(b) by 0 days.

(21) Appl. No.: 13/315,011

(22) Filed: Dec. 8, 2011

(65) Prior Publication Data

US 2013/0034917 A1 Feb. 7, 2013

(30) Foreign Application Priority Data

Aug. 4, 2011 (KR) .................. 10-2011-0077616

(51) Int. Cl.
*H01L 21/00* (2006.01)
*G11C 5/06* (2006.01)

(52) U.S. Cl.
USPC ............... 438/3; 365/158; 365/171; 365/173; 257/295; 257/E27.104

(58) Field of Classification Search
USPC .................................. 438/3; 365/63
See application file for complete search history.

(56) References Cited

U.S. PATENT DOCUMENTS

| 5,635,021 | A | * | 6/1997 | Harafuji | ................ | 438/714 |
| 5,972,785 | A | * | 10/1999 | Shishiguchi et al. | ......... | 438/592 |
| 6,054,352 | A | * | 4/2000 | Ueno | .............. | 438/268 |
| 6,759,263 | B2 | * | 7/2004 | Ying et al. | ........ | 438/48 |
| 6,893,893 | B2 | * | 5/2005 | Nallan et al. | ..... | 438/61 |
| 6,911,156 | B2 | * | 6/2005 | Grynkewich et al. | ........... | 216/22 |
| 6,928,723 | B2 | * | 8/2005 | Carey et al. | ............... | 29/603.07 |
| 6,964,928 | B2 | * | 11/2005 | Ying et al. | ..... | 438/706 |
| 6,984,585 | B2 | * | 1/2006 | Ying et al. | ..... | 438/689 |
| 7,105,361 | B2 | * | 9/2006 | Chen et al. | ......... | 438/3 |
| 7,112,454 | B2 | * | 9/2006 | Drewes et al. | ...... | 438/3 |
| 7,374,952 | B2 | * | 5/2008 | Kasko et al. | ........ | 438/3 |
| 7,531,367 | B2 | * | 5/2009 | Assefa et al. | ....... | 438/3 |
| 7,645,618 | B2 | * | 1/2010 | Ditizio | .............. | 438/3 |
| 7,723,128 | B2 | * | 5/2010 | Wang et al. | ....... | 438/3 |
| 7,948,044 | B2 | * | 5/2011 | Horng et al. | ..... | 257/421 |
| 7,989,224 | B2 | * | 8/2011 | Gaidis | ................. | 438/3 |
| 8,057,925 | B2 | * | 11/2011 | Horng et al. | ................. | 428/811 |
| 8,119,425 | B2 | * | 2/2012 | Cho et al. | ............. | 438/3 |
| 8,133,745 | B2 | * | 3/2012 | Zhong et al. | ....... | 438/3 |
| 8,273,666 | B2 | * | 9/2012 | Xiao et al. | ...... | 438/742 |
| 2006/0039189 | A1 | * | 2/2006 | Chen et al. | ..... | 365/158 |
| 2007/0187785 | A1 | * | 8/2007 | Hung et al. | ......... | 257/421 |
| 2008/0211055 | A1 | * | 9/2008 | Assefa et al. | ................ | 257/506 |
| 2009/0130779 | A1 | * | 5/2009 | Li et al. | ................ | 438/3 |
| 2010/0047929 | A1 | * | 2/2010 | Hong et al. | ........ | 438/3 |
| 2010/0230769 | A1 | * | 9/2010 | Ozaki et al. | .............. | 257/421 |
| 2011/0133300 | A1 | * | 6/2011 | Xiao et al. | ..... | 257/421 |

(Continued)

*Primary Examiner* — Seavosh Nikmanesh
*Assistant Examiner* — Evren Seven
(74) *Attorney, Agent, or Firm* — IP & T Group LLP

(57) ABSTRACT

A method for fabricating a semiconductor device includes forming a plurality of layers which are stacked as a bottom layer, an MTJ layer, and a top layer, patterning the top layer and the MTJ layer using an etch mask pattern to form a top layer pattern and an MTJ pattern, forming a carbon spacer on the sidewalls of the MTJ pattern and the top layer pattern to protect the MTJ pattern and the top layer pattern, and patterning the bottom layer using the carbon spacer and the etch mask pattern as an etch mask to form a bottom layer pattern.

5 Claims, 9 Drawing Sheets

(56) References Cited

U.S. PATENT DOCUMENTS

2011/0189851 A1* 8/2011 Jeong et al. .................. 438/675
2012/0018826 A1* 1/2012 Lee et al. .................... 257/421
2012/0028373 A1* 2/2012 Belen et al. ................... 438/3
2012/0280339 A1* 11/2012 Zhang et al. ................ 257/421

* cited by examiner

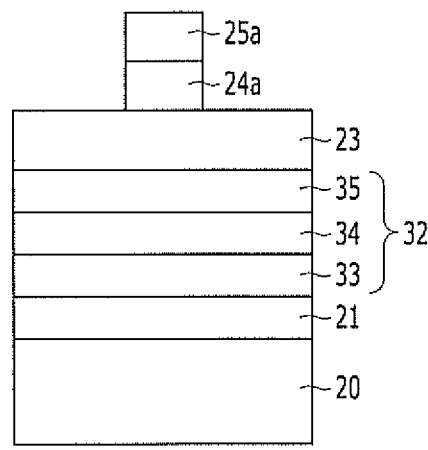
FIG. 3B
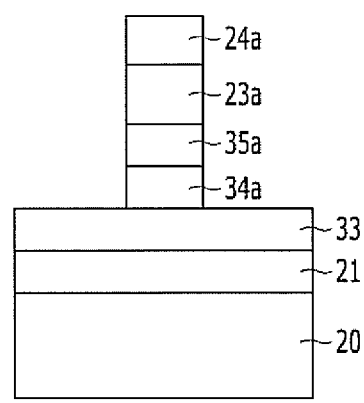

METHOD FOR FABRICATING MAGNETIC TUNNEL JUNCTION DEVICE

CROSS-REFERENCE TO RELATED APPLICATIONS

The present application claims priority of Korean Patent Application No. 10-2011-0077616, filed on Aug. 4, 2011, which is incorporated herein by reference in its entirety.

BACKGROUND

1. Field

Exemplary embodiments of the present invention relate to a device used in an integrated circuit, and more particularly, to a magnetic tunnel junction device.

2. Description of the Related Art

A dynamic random access memory (DRAM) is an exemplary memory device which has been widely used. A DRAM has a feature of operating at a high speed and may be highly integrated. Here, a DRAM is a volatile memory loses data when power is interrupted, and a refresh operation is to be performed to rewrite data periodically.

Also, a flash memory characterized by non-volatility and high degree of integration may have a relatively low operating speed. A magnetoresistive memory device which stores data using a magneto-resistance change may be fabricated as a highly integrated circuit while having non-volatility and high speed operation characteristics.

The magnetoresistive memory device refers to a nonvolatile memory device which stores data using a magneto-resistance changes due to changes in magnetization directions of ferromagnetic materials. The magnetoresistive memory device may include a magneto-resistance element of two magnetic layers. The magneto-resistance element generally has a small resistance when spin directions (magnetic momentum directions) of two magnetic layers are equal to each other and has large resistance when spin directions of the two magnetic layers are opposite to each other. Data may be written to a magnetoresistive memory device by using the fact that the resistance of the magneto-resistance element changes depending on the magnetization states of the magnetic layers.

A magnetoresistive memory device of an MTJ (Magnetic Tunnel Junction) device has a structure of ferromagnetic layer/insulation layer/ferromagnetic layer. When electrons having passed through a first ferromagnetic layer pass through an insulation layer served as a tunneling barrier, a tunneling probability changes depending on a magnetization direction of a second ferromagnetic layer. The tunneling probability becomes a maximum value when the magnetization directions of the two ferromagnetic layers are parallel to each other and the tunneling probability becomes a minimum when the magnetization directions of the two ferromagnetic layers are anti-parallel to each other. The amount of the tunneling current flowing between two ferromagnetic layers depends on the tunneling probability. For example, it may be considered that data '1' (or '0') is written when the tunneling current is large and data '0' (or '1') is written when the tunneling current is small. One of the two ferromagnetic layers serves as a fixed magnetic layer whose magnetization direction is fixed, and the other serves as a free magnetic layer whose magnetization direction is changed in response to an external magnetic field or electric current.

Here, it is difficult to pattern materials constituting an MTJ element, in a general process for manufacturing a semiconductor. A hard mask pattern is generally used for patterning the materials constituting the MTJ element. Since electrode layers disposed over and under an MTJ element are to be patterned by a different patterning process from that of the MTJ element, it becomes more difficult to fabricate a semiconductor device including an MTJ element. A spacer layer may be further formed to protect the MTJ element before patterning the electrode layers. Therefore, a manufacturing process of the semiconductor device may be more complicated.

SUMMARY

An embodiment of the present invention is directed to a method for fabricating a semiconductor device including a magnetic tunnel junction device, which may decrease the number of processes to be performed.

In accordance with an embodiment of the present invention, a method for fabricating a semiconductor device includes forming a plurality of layers which are stacked as a bottom layer, a magnetic tunnel junction (MTJ) layer, and a top layer, patterning the top layer and the MTJ layer using an etch mask pattern to form a top layer pattern and an MTJ pattern, forming a carbon spacer on the sidewalls of the MTJ pattern and the top layer pattern to protect the MTJ pattern and the top layer pattern, and patterning the bottom layer using the carbon spacer and the etch mask pattern as an etch mask to form a bottom layer pattern.

In accordance with another embodiment of the present invention, a method for fabricating a semiconductor device includes forming a plurality of layers which are stacked as a bottom layer, a magnetic tunnel junction (MTJ) layer, and a top layer, patterning the top layer, the MTJ layer, and the bottom layer using an etch mask pattern to form a top layer pattern, an MTJ pattern, and a bottom layer pattern, forming a carbon spacer on the sidewalls of the bottom layer pattern, the MTJ pattern, and the top layer pattern, and performing a cleaning process for removing residues resulting from the patterning of the top, MTJ, and bottom layers wherein the carbon spacer protects the bottom layer pattern, the MTJ pattern, and the top layer pattern during the cleaning process.

In accordance with further embodiment of the present invention, a method for fabricating a semiconductor device includes forming a fixed magnetization layer, a tunnel insulation layer, and a free magnetization layer for a magnetic tunnel junction (MTJ) element, forming an etch mask pattern for the MTJ element over the fixed magnetization layer, the tunnel insulation layer, and the free magnetization layer, patterning the free magnetization layer and the tunnel insulation layer using the etch mask pattern as an etch mask to form a free magnetization layer pattern and a tunnel insulation layer pattern, forming a carbon spacer on the sidewalls of the free magnetization layer pattern and the tunnel insulation layer pattern, and patterning the fixed magnetization layer using the carbon spacer as an etch mask to form a fixed magnetization layer pattern.

BRIEF DESCRIPTION OF THE DRAWINGS

FIGS. 3A to 3C are cross-sectional views illustrating a method of fabricating an exemplary magnetic tunnel junction device.

DETAILED DESCRIPTION

Figure 1A:
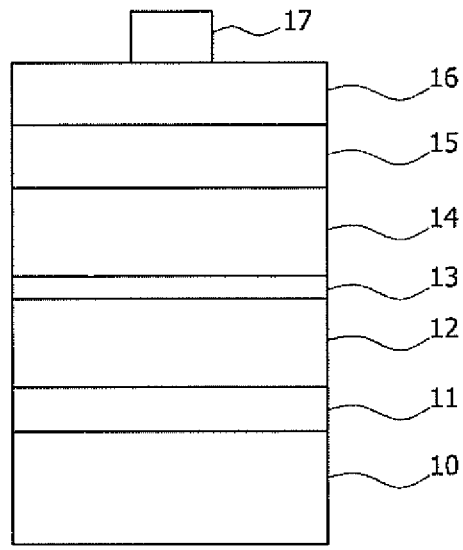
FIGS. 1A to 1F are cross-sectional views illustrating a method for fabricating a magnetic tunnel junction device to illustrate an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In an embodiment of the present invention, a carbon spacer is formed by an in-situ process using a carbon-containing etching gas during an etching process of an MTJ element. The carbon spacer might be a carbon polymer spacer. A nitride spacer deposition process in a low temperature and an etching process using the nitride spacer deposition as a mask according to the conventional art might be replaced with an etching process using the carbon polymer space as an etch barrier.

In using conventional methods, after a patterning process for an MTJ element is performed, an insulation layer is formed over the MTJ element for protection. Then, a bottom layer below the MTJ element is patterned with the insulation layer protecting the MTJ element. A part of the insulation layer is removed during the patterning process for the bottom layer. The patterning process is typically implemented in an ex-situ. The ex-situ means that the patterning processes for the bottom layer and for the MTJ element are implemented in different process chambers.

In an embodiment of the present invention, the carbon spacer is formed by changing process condition in the same chamber where the MTJ element is patterned. The carbon spacer is used as a spacer for protecting an MTJ element. When patterning a bottom layer for a bottom electrode which is placed under the MTJ element, the carbon spacer protects the MTJ element. A protecting layer for an MTJ element may be formed by an in-situ process. That is, the MTJ element and the carbon spacer are formed in the same process chamber.

FIGS. 1A to 1F are cross-sectional views illustrating a method for fabricating a semiconductor device to illustrate an exemplary embodiment of the present invention.

Referring to FIG. 1A, in the fabrication of a magnetic tunnel junction (MTJ) device, a conductive layer 11 for a bottom electrode is formed on a substrate 10, and a layer 12 for an MTJ element is formed on the conductive layer 11. The layer 12 for an MTJ element may include a plurality of layers for the MTJ element but is illustrated as one layer as an example. A conductive layer 13 for a top electrode is formed over the layer 12. Layers 14, 15, and 16 for a hard mask are formed on the conductive layer 13. The respective layers 14, 15, and 16 for a hard mask may include a tantalum layer, a USG layer, and a carbon layer. For example, the tantalum layer may be formed to have a height of 500 Å. Subsequently, a photoresist pattern 17 for a patterning process is formed on the layers 14, 15, and 16.

Figure 1B:
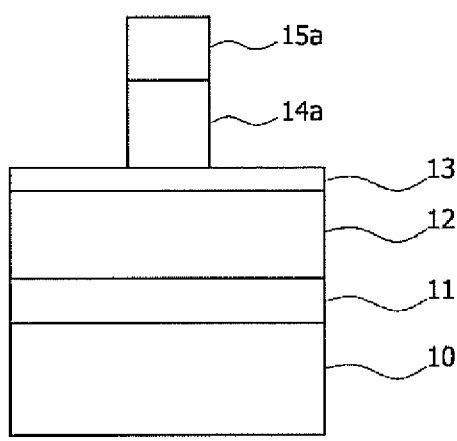

Referring to FIG. 1B, a pattern is formed by etching the layer 16 for a hard mask using the photoresist pattern 17 as an etch mask. By patterning the layers 14 and 15 for a hard mask using the pattern as an etch mask, hard mask patterns 14a and 15a are formed. The pattern of the layer 16 for a hard mask is then removed.

Figure 1C:
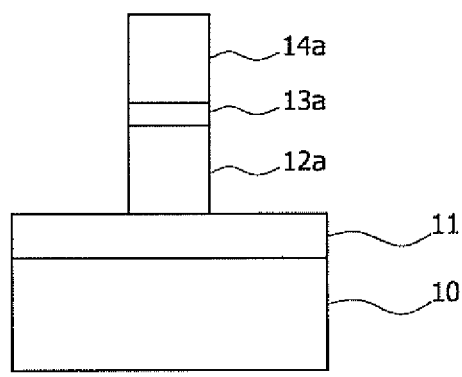

Referring to FIG. 1C, a top electrode 13a and an MTJ element 12a are formed by patterning the conductive layer 13 for a top electrode and the layer 12 for an MTJ element using the hard mask patterns 14a and 15a.

Figure 1D:
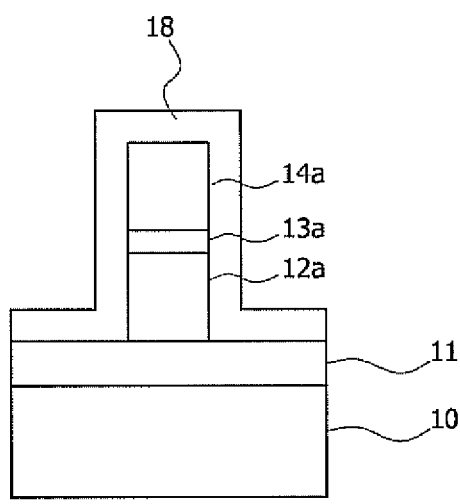

Referring to FIG. 1D, a spacer layer 18 is formed to protect the MTJ element 12a. The spacer layer 18 is formed as a nitride layer in an ex-situ process.

Figure 1E:
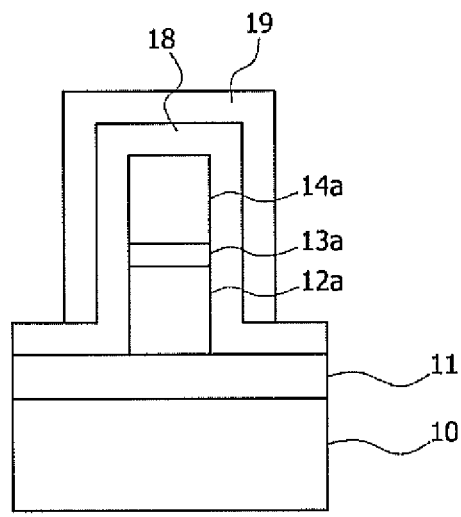

Referring to FIG. 1E, a pattern 19 for patterning a bottom electrode is formed.

Figure 1F:
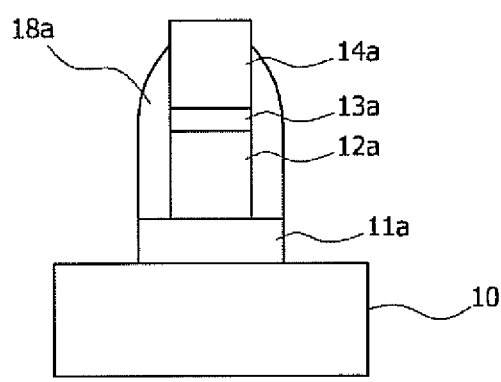

Referring to FIG. 1F, a bottom electrode 11a is formed by patterning the conductive layer 11 for a bottom electrode using the pattern 19 as an etch mask.

As described above, two step etch processes are performed in order to form the MTJ element and the bottom electrode. That is, the manufacturing procedure for the MTJ element and the bottom electrode is complicated.

In particular, an ex-situ process is to be implemented in order to form the spacer layer and the bottom electrode. Two process chambers are to be used for forming a protecting layer of The MTJ element, i.e., the spacer layer, and etching the conductive layer 11 for a bottom electrode. In this procedure, properties of the MTJ element are likely to deteriorate due to contamination from particles, etc.

It may be considered that a bottom electrode is formed with an MTJ element in a single etching process. In this case, when etching an MTJ element, a bottom layer for a bottom electrode (for example, a tantalum/titanium nitride layer) is also etched.

In order to etch the bottom layer which might be a metal layer, Cl or F-based etching gas is to be used. These gases may give a bad influence on characteristics of layers constituting the MTJ element. Therefore, it is difficult to perform an etching process for a bottom electrode without the spacer layer 18 for protecting the MTJ element. In order to address these concerns, one etching process for forming the bottom electrode and the MTJ element may be performed using an etching gas such as CH3OH. However, in this case, since a hard mask pattern used as an etch mask is also etched, the hard mask pattern is to be formed with an increased thickness, thereby reducing a process margin for a semiconductor device including an MTJ element.

Moreover, if the MTJ element is formed using the etching gas such as CH3OH, a cleaning process for removing residues remaining on the substrate is to be performed. Since the MTJ element is likely to be damaged during the cleaning process, it is not easy to perform the cleaning process.

In the present invention, a carbon spacer is formed around an MTJ element by adjusting etching conditions of the MTJ element, e.g., bias power, and using an etching gas of the MTJ element, e.g., $CH_3OH$, for an etching equipment of the MTJ element. Then, by using the spacer as an etch barrier, a process for patterning a conductive layer for a bottom electrode placed under the MTJ element is performed as an in-situ process in the same chamber used for patterning the MTJ element.

Namely, a forming process for the carbon spacer and a patterning process for a bottom electrode may be performed in the same etching chamber. The in-situ process includes the MTJ etching process.

Such processes as in situ processes may contribute to the simplification of processes. Since it is not necessary to exchange chambers for processing, problems caused by moving a wafer from a chamber to another chamber may be reduced. For instance, particles on the water may be minimized.

The carbon spacer protects the exposed surface of the MTJ element and serves as an etch barrier during a subsequent process. Due to the carbon spacer, the conductive layer for a bottom electrode may be etched using Cl or F-based etching gases, and residues on the surface of a substrate may be removed in a wet cleaning process while the MTJ element is safely protected.

FIGS. 2A to 2H are cross-sectional views illustrating a method for fabricating a semiconductor device in accordance with an exemplary embodiment of the present invention.

Figure 2A:
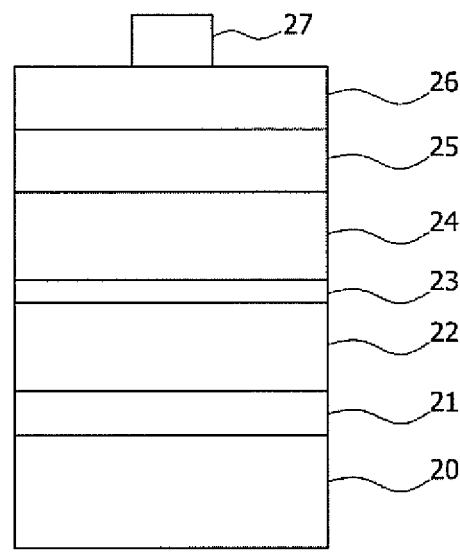
FIGS. 2A to 2H are cross-sectional views illustrating a method for fabricating a magnetic tunnel junction device in accordance with an exemplary embodiment of the present invention.

Referring to FIG. 2A, in the fabrication of an MTJ element, a conductive layer 21 for a bottom electrode is formed on a substrate 20, and a layer 22 for an MTJ element is formed on the conductive layer 21. A conductive layer 23 for a top electrode is formed over the layer 22. Each of the conductive layers 21 and 23 may use at least one selected from the group of a titanium (Ti) layer, a tantalum (Ta) layer, a platinum (Pt) layer, a copper (Cu) layer, a tungsten (W) layer, an aluminum (Al) layer, a titanium nitride (TiN) layer, a tantalum nitride (TaN) layer, and a tungsten silicide (WSi) layer, an alloy layer thereof, or a stacked layer thereof.

The layer 22 for an MTJ element may include a fixed magnetization layer, a tunnel insulation layer, and a free magnetization layer and may also be realized by stacking various types of layers. The fixed magnetization layer is a layer of which magnetization direction is fixed, and the free magnetization layer is a layer of which magnetization direction is changed depending upon a stored data. The fixed magnetization layer may include a pinning layer and/or a pinned layer.

The pinning layer functions to pin the magnetization direction of the pinned layer and may be formed by using a material of anti-ferromagnetism. For example, the material with anti-ferromagnetism may include IrMn, PtMn, MnO, MnS, MnTe, $MnF_2$, $FeF_2$, $FeCl_2$, FeO, $CoCl_2$, CoO, $NiCl_2$, or NiO. The pinning layer may be formed as a single layer constituted by any one of these materials of anti-ferromagnetism or a stacked layer of these materials of anti-ferromagnetism.

The pinned layer, of which magnetization direction is pinned by the pinning layer, and the free magnetization layer may be formed using a material of ferromagnetism. For example, the material with ferromagnetism may include Fe, Co, Ni, Gd, Dy, NIFe, CoFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$. The pinned layer or the free magnetization layer may be formed as a single layer constituted by any one of these materials of ferromagnetism or a stacked layer of these materials of ferromagnetism.

Also, the pinned layer and the free magnetization layer may be formed by stacking any one of the materials with ferromagnetism and a ruthenium (Ru) layer (for example, as CdFe/Ru/CoFe). Further, the pinned layer and the free magnetization layer may be formed as a synthetic anti-ferromagnetic (SAF) layer in which an anti-ferromagnetic coupling spacer layer and a ferromagnetic layer are sequentially stacked. The tunnel insulation layer serves as a tunneling barrier between the fixed magnetization layer and the free magnetization layer and may use any material of insulation characteristics. For example, the tunnel insulation layer may be formed as a magnesium oxide (MgO) layer.

Returning to FIG. 2A, layers 24, 25, and 26 for a hard mask are formed on the conductive layer 23. The respective layers 24, 25, and 26 for a hard mask may use a tantalum layer, a USG layer, and a carbon layer. For example, the tantalum layer may be formed to have a height of 500 Å. A photoresist pattern 27 for a patterning process is formed on the layers 24, 25, and 26.

Figure 2B:
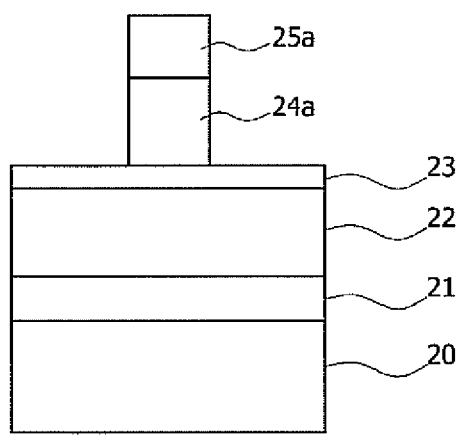

Referring to FIG. 2B, by etching the layer 26 using the photoresist pattern 27 as an etch mask, a pattern is formed from the layer 26. After the layers 24 and 25 for a hard mask are patterned using the pattern as an etch mask, hard mask patterns 24a and 25a are formed. The pattern formed from the layer 26 and the photoresist pattern 27 are removed.

Figure 2C:
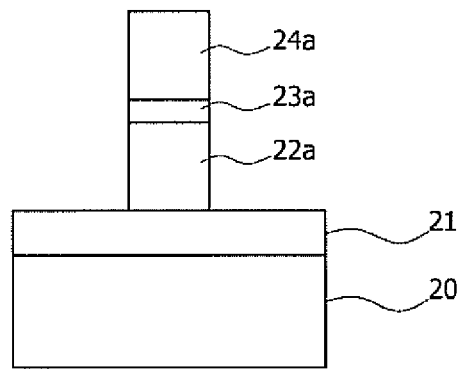

Referring to FIG. 2C, the conductive layer 23 for a top electrode and the layer 22 for an MTJ element are patterned using the hard mask patterns 24a and 25a, and a top electrode 23a and an MTJ element 22a are formed. $CH_3OH$ or $CO/NH_3$ may be used as an etching gas for the MTJ element 22a, and in particular, a carbon-containing $C_xH_yO_z$-based gas may be used when the layer 22 for an MTJ element is patterned. Further, a carbon-containing gas may include CH3OH, CO/NH3, or CH4.

Figure 2D:
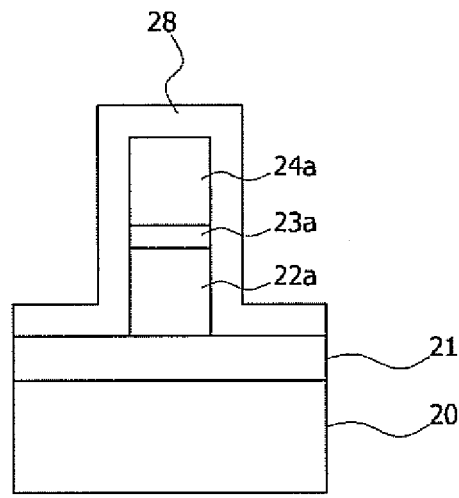

Referring to FIG. 2D, a carbon coating layer 28 is formed to cover the MTJ element 22a.

In the case where the MTJ element 22a is etched using the above-described gas, a carbon-based deposition layer may be generated instead of etching the surface of the substrate if bombardment of ions generated from plasma gas does not occur on the surface of the substrate. The carbon coating layer has properties similar to an amorphous carbon deposition layer and contains some hydrogen and oxygen.

After the etching process for the MTJ element including MgO or CoFe is completed using the $C_xH_yO_z$ gas, if bias power applied to the surface of the substrate is adjusted in a predetermined range, the carbon coating layer is deposited on the surface of the substrate. The adjusting operation includes that the supply of the bias power is interrupted or is reduced. The carbon coating layer formed in this process is a kind of layer deposited by a plasma enhanced chemical vapor deposition (PECVD) process, and it may be uniformly deposited on the sidewall of a pattern structure perpendicular to the plane of the substrate.

Figure 2E:
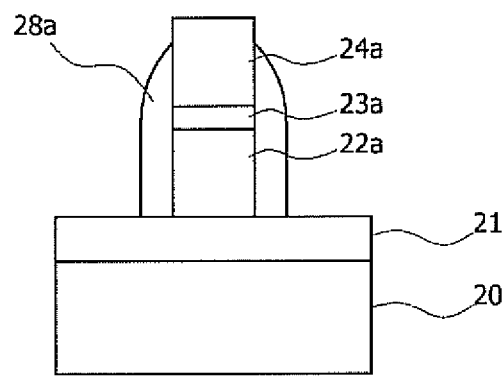

Referring to FIG. 2E, a carbon spacer 28a is formed using the carbon coating layer 28. By dry-etching the carbon coating layer deposited on the entire surface of the wafer using an etching gas such as O, F, and Cl, the carbon spacer 28a is formed for protecting the MTJ element 22a.

Figure 2F:
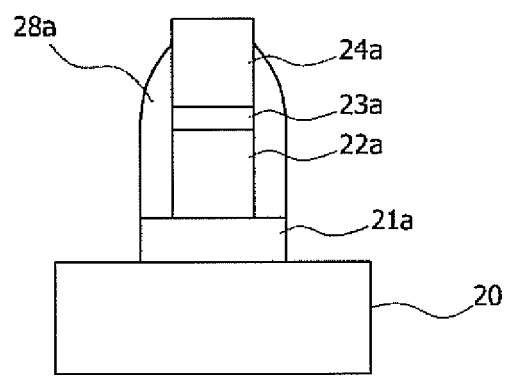

Referring to FIG. 2F, after the carbon spacer 28a is formed on the sidewall of the MTJ element 22a, the conductive layer 21 for a bottom electrode, for example, a Ta/TiN layer, is etched by using the carbon spacer 28a as an etch barrier. In order to etch Ta and TiN layers, a halogen element such as F and Cl is to be used. Because an etching gas using the halogen element might exert an influence on the characteristics of the MTJ element 22a, a spacer for protecting the sidewall of the MTJ element 22a is to be formed. The carbon spacer 28a according to present embodiment protects the sidewall of the MTJ element 22a.

After a bottom metal electrode is formed using an F or Cl gas, etching residues are removed through a wet-etching process. Due to the carbon spacer 28a, the MTJ element 22a may be protected during the wet-etching process.

Due to the carbon spacer 28a, $Cl_2$ gas capable of removing a metal at a high etching speed may be used with $CH_3OH$ or $CO/NH_3$ as an etching gas. Therefore, etching selectivity to the hard mask pattern 24a may be sufficiently increased, and the loss of the hard mask pattern 24a may be reduced. Accordingly, the process margin of the hard mask pattern may be increased.

Figure 2G:
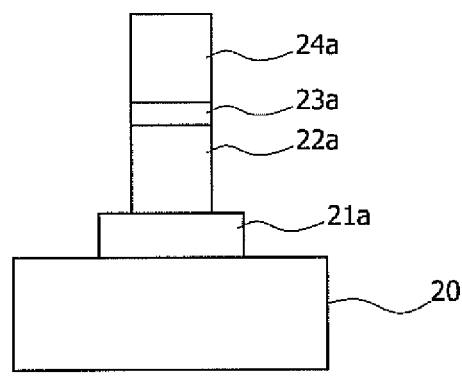
Figure 2H:
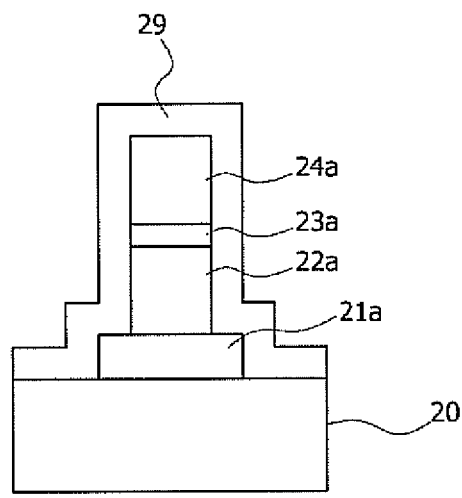

Referring to FIG. 2G, the carbon spacer 28a is removed by an O2 asking process. The carbon spacer 28a may remain if the carbon spacer 28a does not exert a substantial influence on a subsequent process. Referring to FIG. 2H, a capping layer 29 is formed over the MTJ element 22a.

Figure 3C:
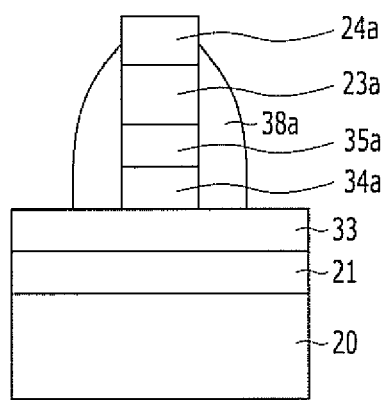

In another embodiment, an MTJ element fabrication process may be performed in a variety of ways depending upon when the carbon spacer layer is formed. In order for the MTJ element, the spacer layer may be formed after the MTJ layer is entirely or partially etched. Otherwise, the carbon spacer may be formed after the conductive layer for a bottom electrode is etched. In other words, referring to FIG. 3a-3c, while the MTJ layer 32 is constituted by the structure of a fixed layer 33, a tunnel insulation layer 34, and a free layer 35, the carbon spacer 38a may be formed when the tunnel insulation layer 34 and the free layer 35 are etched to form a tunnel insulation layer pattern 34a and a free layer pattern 35a, and the fixed layer 33 is exposed.

Also, when etching the conductive layer for a bottom electrode after the etching process for the MTJ layer is completed, the carbon spacer layer may be formed in order to protect the exposed surface of the MTJ element from an etching gas and a subsequent cleaning process. In addition, the carbon spacer may be formed after the bottom electrode is formed, and the carbon spacer may be used as a capping material for the MTJ element during a subsequent cleaning process. When performing a wet etching for the surface of the substrate, the sidewall of the MTJ element may be protected.

As described above, in the method shown in FIGS. 1A to 1F, two etching patterns are to be formed for finishing the upper electrode, the MTJ element, and the bottom electrode. One pattern is the photoresist pattern 17 for patterning the layers 14, 15, and 16 and the other is the pattern 19 for patterning the bottom electrode. However, the method in accordance with the embodiment of the present invention may include one etch pattern for finishing the upper electrode, the MTJ element, and the bottom electrode due to the presence of the carbon spacer layer. The one etch pattern is the photoresist pattern 27 for the layers 24, 25, and 26. That is, if a carbon spacer is used according to the embodiment of the present invention, it is not necessary to perform two masking processes for forming a semiconductor device including an MTJ element.

If a nitride spacer instead of a carbon spacer is formed to protect an MTJ layer, two chambers are to be employed for finishing an MTJ element. On contrary, if the carbon spacer according to the embodiment of the present invention is used, an in-situ process may be performed and one chamber is to be used for finishing an MT) element. That is to say, the in-situ process means that an etching process for an MTJ element, a carbon spacer deposition process, and an etching process using a carbon spacer may be sequentially performed in the same etching chamber.

As the carbon spacer is formed after etching the MT) layer, a conductive layer for a bottom electrode may be etched using a halogen element such as Cl and F. Therefore, etching selectivity to a hard mask pattern may be increased, and thus, the process margin of a hard mask pattern used as an etch mask arranged on the MTJ layer may be increased.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a fixed magnetization layer, a tunnel insulation layer, and a free magnetization layer for a magnetic tunnel junction (MTJ) element;
    forming an etch mask pattern for the MTJ element over the fixed magnetization layer, the tunnel insulation layer, and the free magnetization layer;
    patterning the free magnetization layer and the tunnel insulation layer using the etch mask pattern as an etch mask to form a free magnetization layer pattern and a tunnel insulation layer pattern;
    forming a carbon spacer on the sidewalls of the free magnetization layer pattern and the tunnel insulation layer pattern; and
    patterning the fixed magnetization layer using the carbon spacer formed on the sidewalls of the free magnetization layer pattern and the tunnel insulation layer pattern as an etch mask to form a fixed magnetization layer pattern after patterning the free magnetization layer and the tunnel insulation layer.

2. The method according to claim 1, wherein the forming of the free magnetization layer pattern and the tunnel insulation layer pattern and the forming of the carbon spacer on the sidewalls are performed as an in-situ process.

3. The method according to claim 1, wherein the forming of the free magnetization layer pattern and the tunnel insulation layer pattern, the forming of the carbon spacer on the sidewalls, and the forming of the fixed magnetization layer are performed as an in-situ process.

4. The method according to claim 1, wherein the forming the free magnetization layer pattern and the tunnel insulation layer pattern is performed using a carbon-containing etching gas, and the forming of the carbon spacer on the sidewalls is performed by using the carbon-containing etching gas and controlling a bias power.

5. The method according to claim 1, wherein the forming of the carbon spacer on the sidewalls is performed under conditions substantially the same as that of the forming of the free magnetization layer pattern and the tunnel insulation layer pattern by adjusting a bias power applied in the method.

* * * * *